United States Patent
Kau

(10) Patent No.: US 8,049,197 B2
(45) Date of Patent: Nov. 1, 2011

(54) SELF-ALIGNED NANO-CROSS-POINT PHASE CHANGE MEMORY

(75) Inventor: DerChang Kau, Cupertino, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 381 days.

(21) Appl. No.: 12/346,702

(22) Filed: Dec. 30, 2008

(65) Prior Publication Data

US 2010/0163832 A1 Jul. 1, 2010

(51) Int. Cl.
*H01L 29/04* (2006.01)

(52) U.S. Cl. ............ 257/3; 257/4; 257/5; 257/289; 257/E29.105; 438/900; 365/148

(58) Field of Classification Search ............ 257/2–5, 257/48, 289, 797, E29.105; 438/900; 365/145, 365/148, 175

See application file for complete search history.

(56) References Cited

U.S. PATENT DOCUMENTS

| | | | |
|---|---|---|---|
| 6,462,984 B1 * | 10/2002 | Xu et al. | 365/175 |
| 7,244,956 B2 | 7/2007 | Pellizzer | |
| 7,422,926 B2 | 9/2008 | Pellizzer et al. | |
| 2007/0057341 A9 * | 3/2007 | Pellizzer | 257/528 |

* cited by examiner

*Primary Examiner* — Evan Pert
*Assistant Examiner* — Scott R Wilson
(74) *Attorney, Agent, or Firm* — Lisa K. Jorgenson; Robert Iannucci; Seed IP Law Group PLLC

(57) ABSTRACT

One embodiment is a phase change memory that includes a heater element transversely contacting a storage element of phase change material. In particular, an end of the storage element contacts an end of the heater element. A first pair of dielectric spacers is positioned on opposite sides of the first heater element and a second pair of dielectric spacers is positioned on opposite sides of the first storage element. The storage element, heater element, and first and second pairs of dielectric spacers can be made by a spacer patterning technique.

33 Claims, 9 Drawing Sheets

SELF-ALIGNED NANO-CROSS-POINT PHASE CHANGE MEMORY

BACKGROUND

1. Technical Field

The present invention relates generally to phase change memories.

2. Description of the Related Art

As is known, phase change memories use a class of materials that have the property of switching between two phases having distinct electrical characteristics, associated to two different crystallographic structures of the material, and precisely an amorphous, disorderly phase and a crystalline or polycrystalline, orderly phase. The two phases have resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$), which is now widely used for storing information on overwritable disks and has been also proposed for mass storage.

In the chalcogenides, the resistivity varies by two or more orders of magnitude when the material passes from the amorphous (more resistive) phase to the crystalline (more conductive) phase, and vice versa.

Phase change can be obtained by locally increasing the temperature. Below 150° C., both phases are stable. Starting from an amorphous state, and rising the temperature above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then rapidly cool off the chalcogenide.

In a phase change memory, a plurality of memory cells are arranged in rows and columns to form an array. Each memory cell is coupled to a respective selection element, which may be implemented by any switching device, such as an ovonic threshold switch (OTS), a PN diode, a bipolar junction transistor or a MOS transistor. Each memory cell includes a memory region of a chalcogenide material in contact with a resistive electrode, also called heater. A storage element is formed at a contact area between the chalcogenide region and the heater. The heater is connected to a conduction terminal of the selection element.

In fact, from an electrical point of view, the crystallization temperature and the melting temperature are obtained by causing an electric current to flow through the resistive electrode in contact or close proximity with the chalcogenic material and thus heating the chalcogenic material by Joule effect. In particular, when the chalcogenic material is in the amorphous, high resistivity state (also called the reset state), applying a voltage/current pulse of a suitable length and amplitude and allowing the chalcogenic material to cool slowly causes the chalcogenic material changes its state and switch from a high resistivity to a low resistivity state (also called the set state). Vice versa, when the chalcogenic material is in the set state, applying a voltage/current pulse of suitable length and high amplitude causes the chalcogenic material to switch to the amorphous phase.

BRIEF SUMMARY

One embodiment is a phase change memory that includes a first heater element transversely contacting a first storage element of phase change material. In particular, an end of the storage element contacts an end of the heater element. A first pair of dielectric spacers is positioned on opposite sides of the first heater element and a second pair of dielectric spacers is positioned on opposite sides of the first storage element.

One embodiment is a method that deploys a self-aligned scheme between heaters and PCM storage elements using a pitch multiplication patterning method. A sub-lithography patterning for the interface between heater and storage element is possible due to the following two features:

1) with a pitch multiplication method, the heaters and PCM storage elements are formed as spacers of the pitch-multiplied pattern;

2) with the self-aligned scheme between heaters and storage elements, no registration overlay is required. This reliably creates a sub-lithographic device feature. These two features reliably create a sub-lithographic cross-point phase change memory at lower cost of patterning tools.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with phase change memories have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Figure 1:
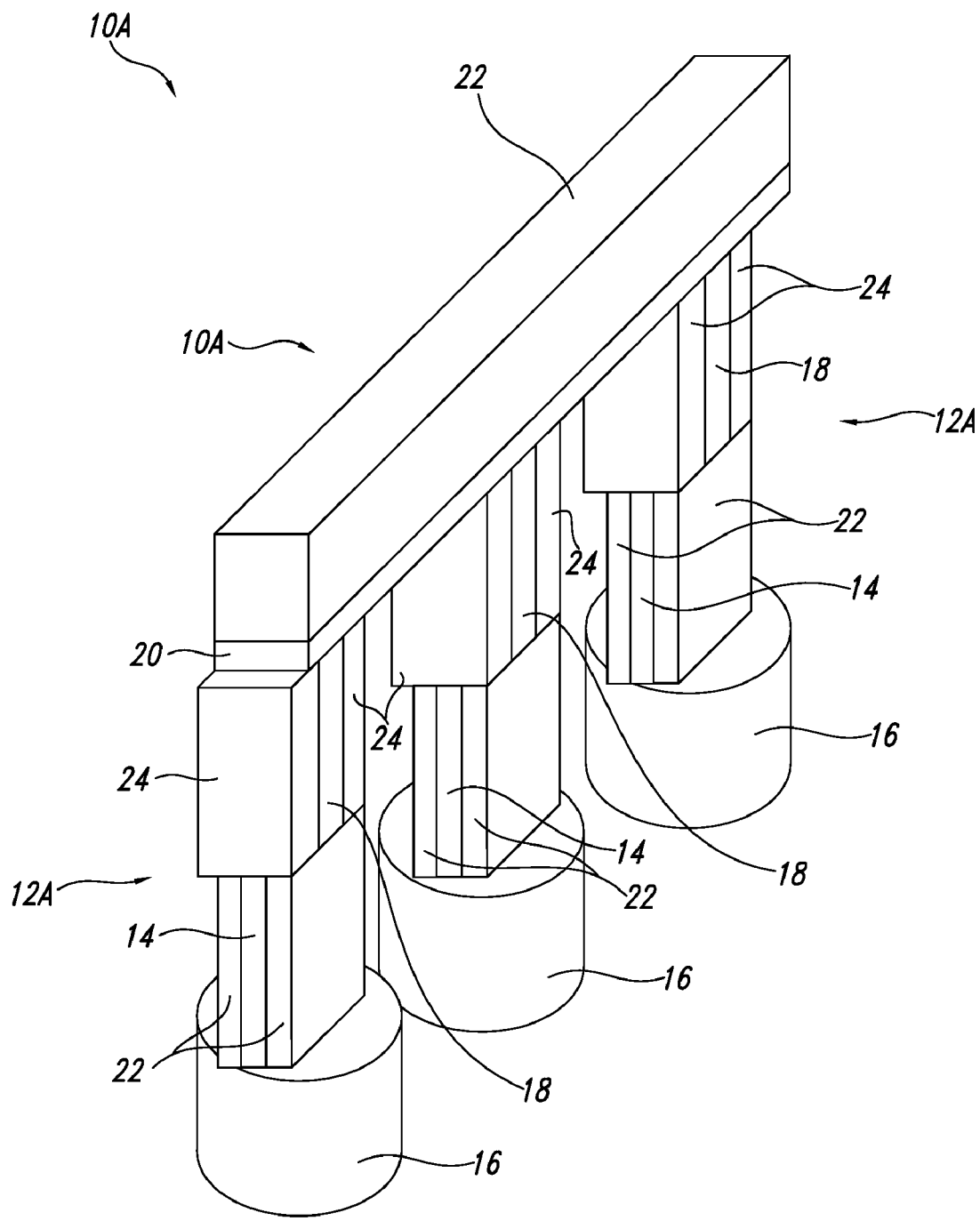
FIG. 1 is a schematic isometric view of a phase change memory of one embodiment.

One embodiment is a phase change memory (PCM) device 10A shown in FIG. 1. The PCM device 10A includes an array of PCM cells 12A. Only three PCM cells are shown for convenience of illustration. Those skilled in the art will understand that the PCM device 10A could include an array of much more such PCM cells.

Each PCM cell 12A includes a PCM storage element 14 made of a phase change material. Preferably, the storage element has a sublithographic thickness, and in one embodiment is in the range of 5-20 nm. The phase change material is a phase change material suitable for non-volatile memory data storage having electrical properties (e.g., resistance) that may be changed through the application of energy such as, for example, heat, light, voltage potential, or electrical current. An example of a phase change materials include a chalcogenide material, which is a material that includes at least one element from column VI of the periodic table or that includes one or more of the chalcogen elements, e.g., any of the elements of tellurium, sulfur, or selenium. In one embodiment, the memory material is a chalcogenide element composition from the class of tellurium-germanium-antimony material or a GeSbTe alloy (($Te_xGe_ySb_z$, such as x=2, y=2, z=5), although the scope of the present disclosure is not limited to just these materials.

The storage elements 14 are formed on respective conductive bottom electrodes 16 that could simply correspond on a 1 to 1 basis with the storage elements 14 as shown in FIG. 1. Alternatively, each bottom electrode 16 can be an elongated strip on which an entire row or column of storage elements 14 can be formed. In one embodiment, the bottom electrodes 16 are extend entirely along a conductive wordline or bitline (not shown) of the array of the PCM device 10A.

Extending transversely on and in contact with the storage elements 14 respectively are heaters 18 of a resistive material. Preferably, the each heater 18 has a sublithographic thickness such that the heater 18 and the corresponding storage element 14 contact one another at a contact surface that is sublithographic in two dimensions. In one embodiment the thickness of each heater is in the range of 5-20 nm. The heaters 18 may be formed, for example, from titanium silicon nitride. However, other heater materials may also be used.

A top electrode 20 extends transversely on the heaters 18 and a conductive line 22 extends along the length of the top electrode 20. The conductive line 22 can be a bitline or a wordline of the array of the PCM device 10A.

In the embodiment shown in FIG. 1, each of the storage elements 14 is sandwiched by a pair of dielectric spacers 26 and each of the heater elements is sandwiched by a pair of dielectric spacers 28. Like the storage elements 14 and heaters 18, each of the dielectric spacers 26, 28 preferably has a sublithographic thickness that in one embodiment is in the range of 5-20 nm. As discussed in more detailed below, in one embodiment all of the storage elements 14, heaters 18, and dielectric spacers 26, 28 are formed using a spacer patterning technique in which spacer layers are formed along sidewalls of structures and then anisotropically etched to leave spacer structures have sublithographic thicknesses.

Figure 2:
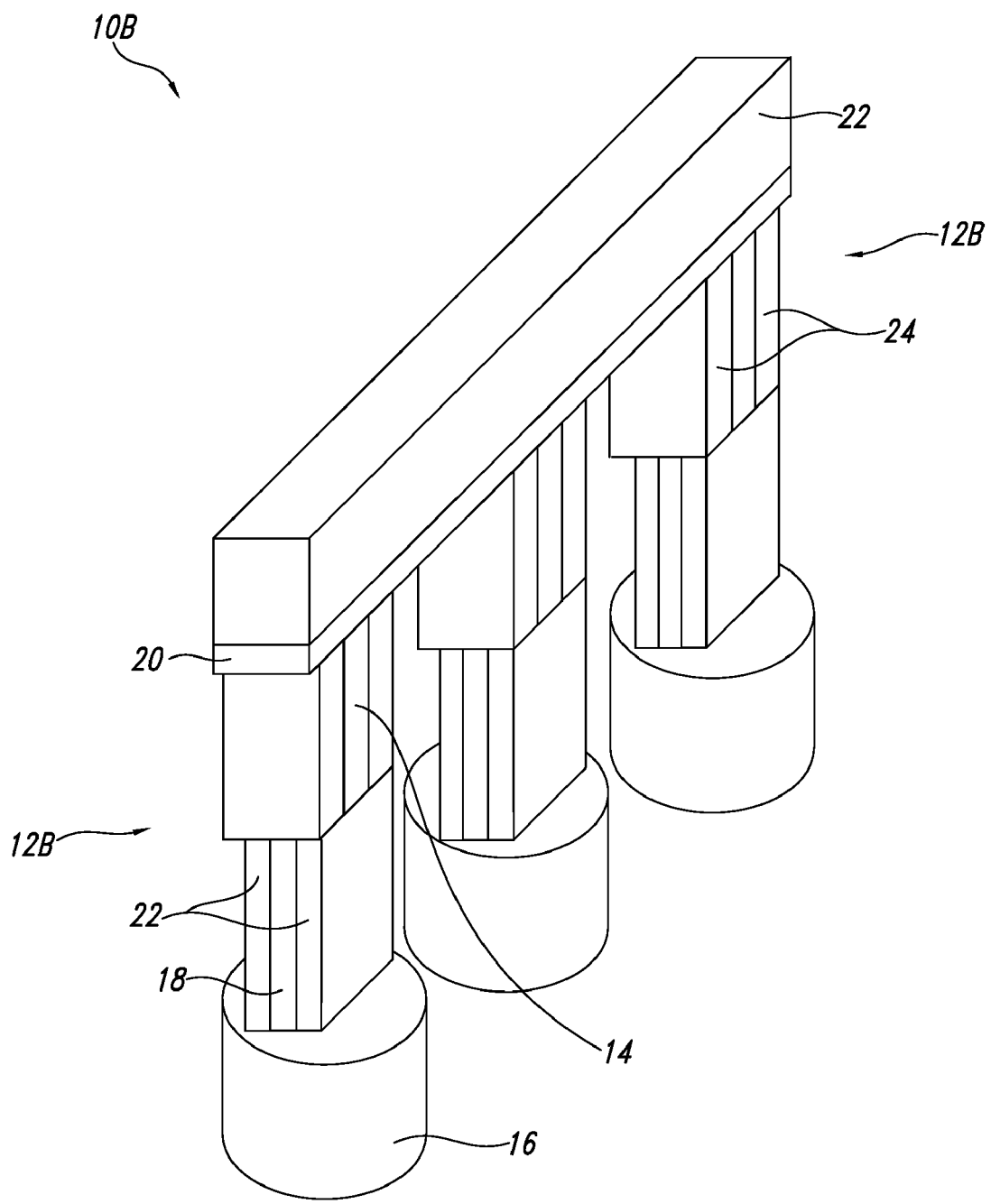
FIG. 2 is a schematic isometric view of a phase change memory of one embodiment.

FIG. 2 shows an alternative PCM device 10B. This alternative embodiment, and those alternative embodiments and other alternatives described herein, are substantially similar to previously described embodiments, and common acts and structures are identified by the same reference numbers. Only significant differences in operation and structure are described below.

The PCM device 10B shown in FIG. 2 is similar to the PCM device 10A of FIG. 1 except that the heaters 18 are positioned on the bottom electrodes 16 and the storage elements 14 are positioned between the heaters 18 and the top electrode 20. As such, the PCM device 10B includes a set of PCM cells 12B that each include one of the heaters 18 in contact with a corresponding one of the storage elements 14. It will be immediately apparent to those skilled in the art that the same method may be used to make both of the PCM devices 10A, 10B except for the change in positioning of the storage elements 14 and heaters 18.

Figure 3:
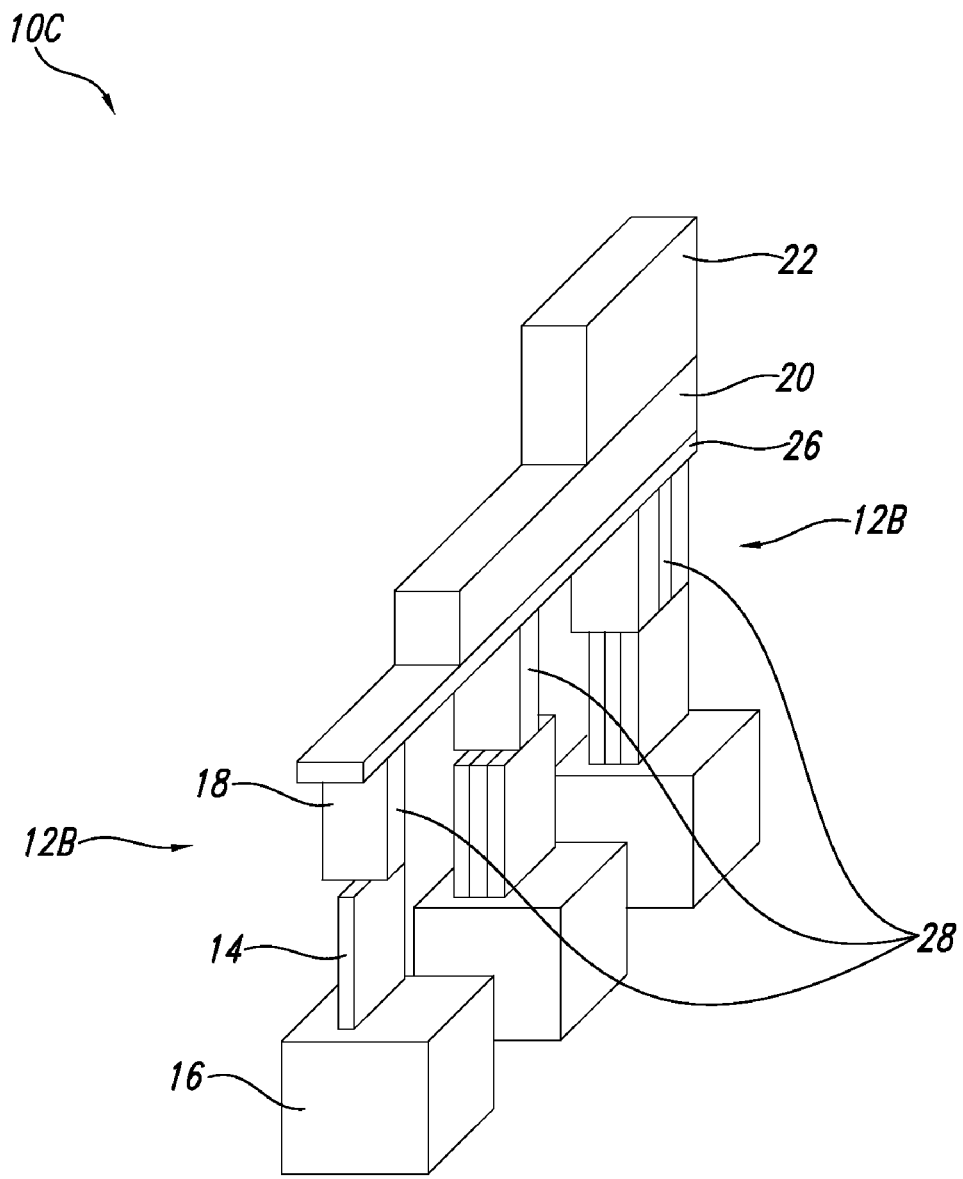
FIG. 3 is a schematic isometric view of a phase change memory of one embodiment.

A PCM device 10C according to one embodiment is shown in FIG. 3. The PCM device 10C is like the PCM device 10A of FIG. 1 except that the PCM device 10C includes an ovonic threshold switch (OTS) layer 26 positioned between the heaters 18 and the top electrode 20. In one embodiment, the OTS layer 26 is a switch material such as a chalcogenide alloy or a pnictide alloy. In effect, the OTS layer 26 forms ovonic threshold switches 28 at the intersections of the OTS layer 26 and the heaters 18, respectively. As a result, the PCM device 10C includes a plurality of PCM cells 12C each including one of the storage elements 14, one of the heaters 18, and one of the OTS 28.

An ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

The switch material may be a material in a substantially amorphous state, positioned between two electrodes, that may be repeatedly and reversibly switched between a higher resistance off state that is greater than about 10 megaOhms and a relatively lower resistance on state that is about 1000 Ohms in series with the holding voltage by the application of electrical current or potential.

Each switch has an IV curve similar to that of a phase change memory element that is in an amorphous state. However, unlike a phase change memory element, the ovonic threshold switch does not change phase. That is, the switching material of the ovonic threshold switch is not a programmable material and, as a result, the switch may not be a memory device capable of storing information. For example, the switching material may remain permanently amorphous and the IV characteristics may remain the same throughout the operating life.

In the low voltage, a low electric field mode, where the voltage applied across the switch is less than the threshold voltage $V_{th}$, the switch may be off or non-conducting and exhibits a relatively high resistance (greater than about 10 megaOhms). The switch may remain in the off state until its sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

The PCM devices 10A-10C of FIGS. 1-3 can be manufactured according to a method that deploys a self-aligned scheme between the heaters 18 and PCM storage elements 14 using a pitch multiplication patterning method. A sub-lithography patterning for the interface between the heaters and storage elements is possible.

In one embodiment, the heaters are first aligned on conduction contacts of respective selection elements. Since minimization of the contact area between the heaters and the chalcogenic regions is desired in phase change memory cells, the heaters are normally in the form of walls or rods having sub-lithographic cross-dimensions, i.e., thickness or diameter ("sublithographic" means here a linear dimension smaller than the minimum dimension achievable with current UV lithographic techniques, and hence smaller than 50 nm). In one embodiment, the sub-lithographic cross-dimensions of the heaters and storage elements are approximately 5-20 nm. Structures having such small dimensions can be made by controlled layer deposition steps.

Figure 4:
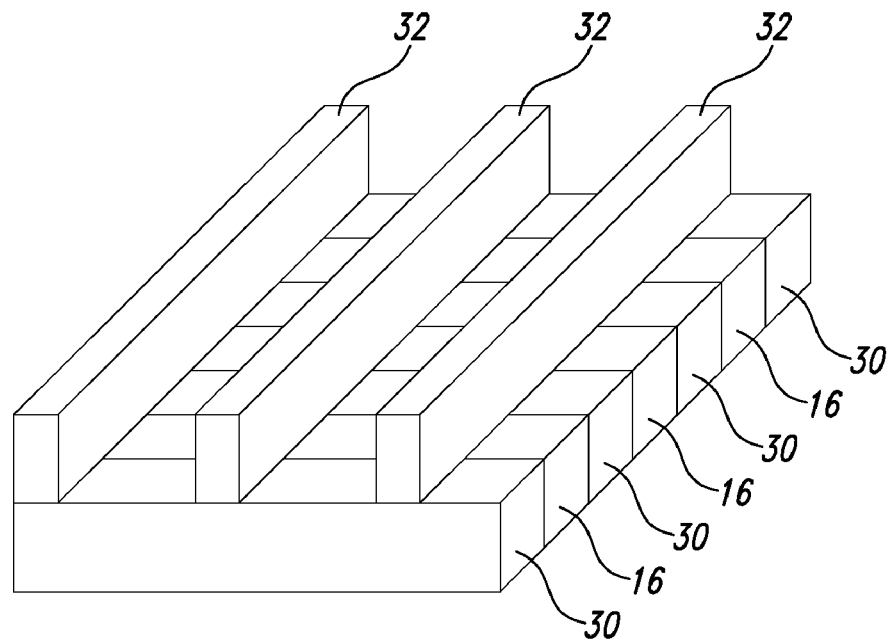
FIG. 4 is an isometric view of the phase change memory of FIG. 2A in a manufacturing step.

FIGS. 4-13 show various steps of a process for manufacturing a PCM device 10 according to one embodiment. FIG. 4 shows a series of strip-shaped bottom electrodes 16 alternately positioned with a series of first dielectric strips 30. The first dielectric strips 30 may be formed of a first dielectric material, such as silicon oxide or silicon nitride.

The order in which the bottom electrodes 16 and first dielectric strips 30 are formed is not important. One could first form a dielectric layer, etch the dielectric layer using a mask into the series of first dielectric strips 30 spaced apart from one another, and then form the bottom electrodes 16 between the first dielectric strips. For example, one could deposit a conductive layer on the first dielectric strips and etch back until the electrodes and first dielectric strips have the same height. Alternatively, one could first form a conductive layer, etch the conductive layer using a mask into the series of strip-shaped bottom electrodes 16 spaced apart from one another, and then form the first dielectric strips 30 between the bottom electrodes, such as by depositing a dielectric layer on the bottom electrodes and etching back until the bottom electrodes and first dielectric strips have the same height.

Next, a series of second dielectric strips 32 is formed transversely on the bottom electrodes 16 and the first dielectric strips 30. In one embodiment, the second dielectric strips 32 are spaced apart from each other at a pitch that is twice the pitch at which the PCM storage elements 18 will be formed. Like the first dielectric strips 30, the second dielectric strips 32 can be formed by depositing a dielectric sheet layer, and then etching back using a strip-shaped mask.

In one embodiment, the second dielectric strips 32 are formed of a second dielectric material that is different than the first dielectric material used to form the first dielectric strips 30. For example, if the first dielectric material is silicon oxide, the second dielectric material can be silicon nitride or various other dielectric materials. The use of such different dielectric materials enables the second dielectric strips 32 to be etched without etching the first dielectric strips 30. Alternatively, the same dielectric materials could be used for the first and second dielectric strips 30, 32 and an etch stop layer, of a different material than the second dielectric strips 32, could be employed between the first and second dielectric strips 30, 32 to accomplish the same selective etching function. Another alternative is to use the same dielectric materials for the first and second dielectric strips 30, 32 with the etch stop layer, and stop the etching of the dielectric layer used to make the second dielectric strips 32 when the underlying bottom electrodes 16 are reached.

Figure 5:
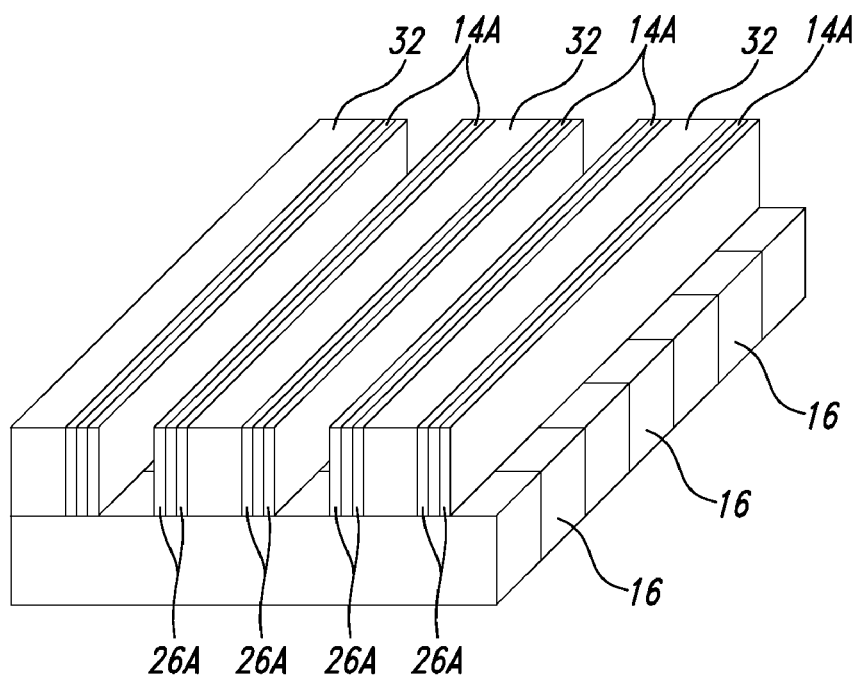
FIG. 5 is an isometric view of the phase change memory of FIG. 2A in another manufacturing step.

Next, as shown in FIG. 5, a series of phase change spacer layers 14A and dielectric spacer layers 26A are formed on opposite sidewalls of the second dielectric strips 32. In one embodiment, the dielectric spacer layers 26A are formed with a third dielectric material that is selectively etchable with respect to the first and second dielectric strips 30, 32. The phase change spacer layers 14A and dielectric spacer layers 26A can be formed using known spacer patterning techniques. For example, first ones of the dielectric spacer layers 26A can be formed by conformally depositing a dielectric layer one the exposed top surface portions of the first electrodes 16 and the first dielectric strips 30 and on the top and side walls of the second dielectric strips 32 and anisotropically etching the deposited dielectric layer until the first electrodes 16 and first dielectric strips 30 are exposed, which leaves the dielectric spacer layers 26A on the sidewalls of the second dielectric strips 32. A similar process is performed to form the phase change spacer layers 14A using a conformally deposited and anisotropically etch phase change layer. Another similar process is performed to form the second ones of the dielectric spacer layers 26A on the phase change spacer layers 14A, thereby sandwiching the phase change spacer layers 14A between the dielectric spacer layers 26A.

Figure 6:
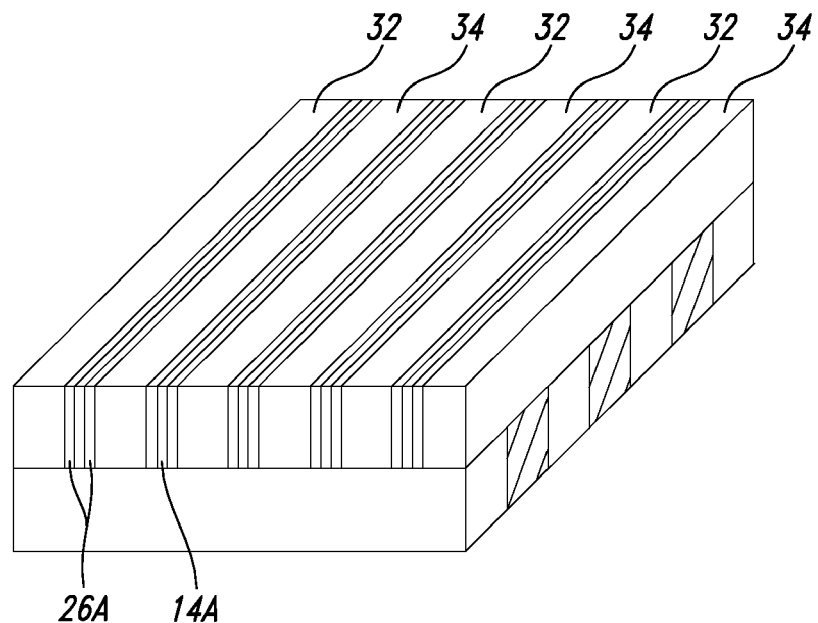
FIG. 6 is an isometric view of the phase change memory of FIG. 2A in another manufacturing step.

In FIG. 6, first dielectric filler strips 34 are formed between the structures formed by the second dielectric strips 32, dielectric spacer layers 26A, and phase change spacer layers 14A. Such dielectric filler strips 34 can be formed by conformally depositing another dielectric layer and planarizing, such as by CMP, the dielectric layer until the dielectric filler strips 34 have the same height as the second dielectric strips 32, dielectric spacer layers 26A, and phase change spacer layers 14. In one embodiment, the dielectric filler strips 34 are of the same dielectric material as the second dielectric strips 32, although other dielectric materials could also be employed.

Figure 7:
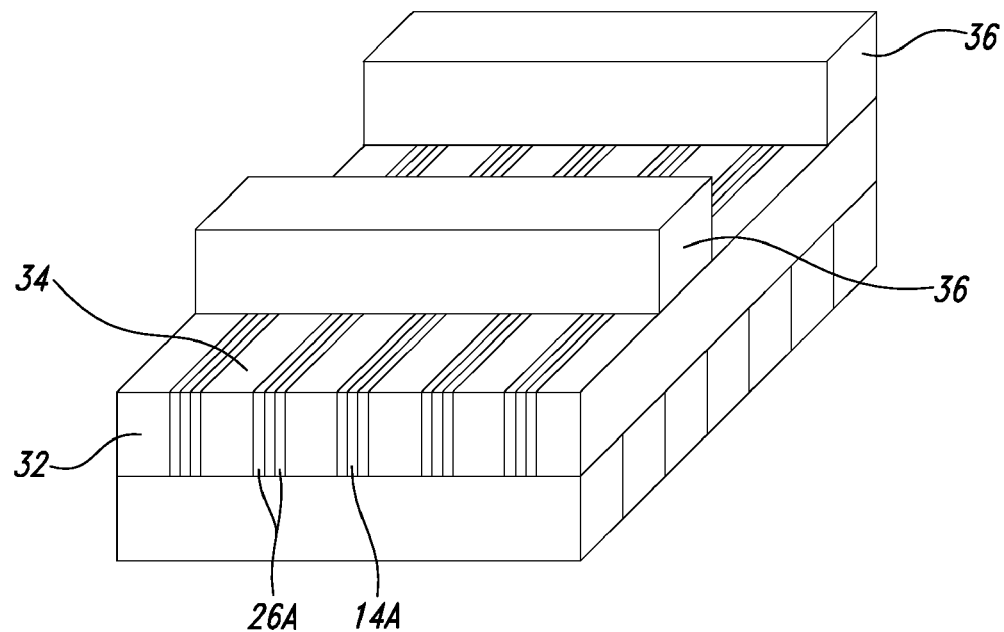
FIG. 7 is an isometric view of the phase change memory of FIG. 2A in another manufacturing step.

Next, a series of third dielectric strips 36 is formed transversely on the dielectric filler strips 34, second dielectric strips 32, dielectric spacer layers 26A, and phase change spacer layers 14A, as shown in FIG. 7. In one embodiment, the third dielectric strips 36 are spaced apart from each other at a pitch that is twice the pitch at which the PCM storage elements 18 will be formed. The third dielectric strips 36 can be formed of the same second dielectric material as the second dielectric strips 32, or a different dielectric material can be used. The third dielectric strips 36 can be formed by the same process as is used to form the first and second dielectric strips 30, 32, or other know techniques could be employed.

Figure 8:
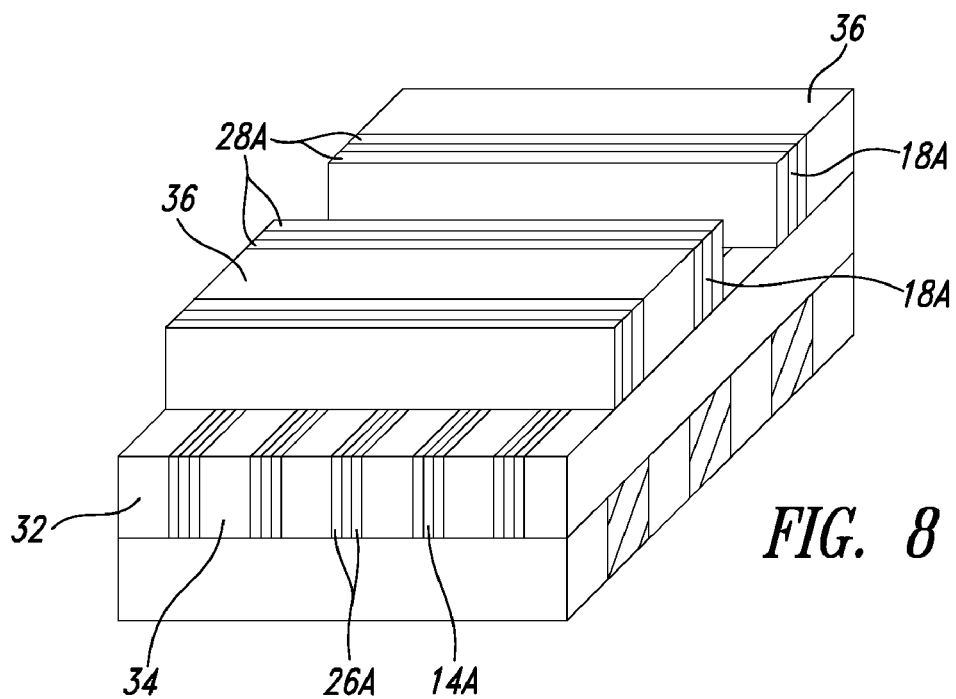
FIG. 8 is an isometric view of the phase change memory of FIG. 2A in another manufacturing step.

Next, as shown in FIG. 8, a series of heater spacer layers 18A and second dielectric spacer layers 28A are formed on opposite sidewalls of the third dielectric strips 36. The heater spacer layers 18A can be made of any resistive material, such as titanium silicon nitride. In one embodiment, the dielectric spacer layers 26A are formed with a fourth dielectric material that is selectively etchable with respect to the third dielectric strips 36 and the underlying second dielectric strips 32 and first dielectric spacer layers 26A. The fourth dielectric material can be the same as the first dielectric material, or different. The heater spacer layers 18A and dielectric spacer layers 28A can be formed using known spacer patterning techniques, such as those described above for the phase change spacer layers 14A and dielectric spacer layers 26A. The resulting structure includes first and second sandwich structures, each including heater spacer layers 18A sandwiched by spacer layers 28A, on opposite sides of the third dielectric strips 36.

Figure 9:
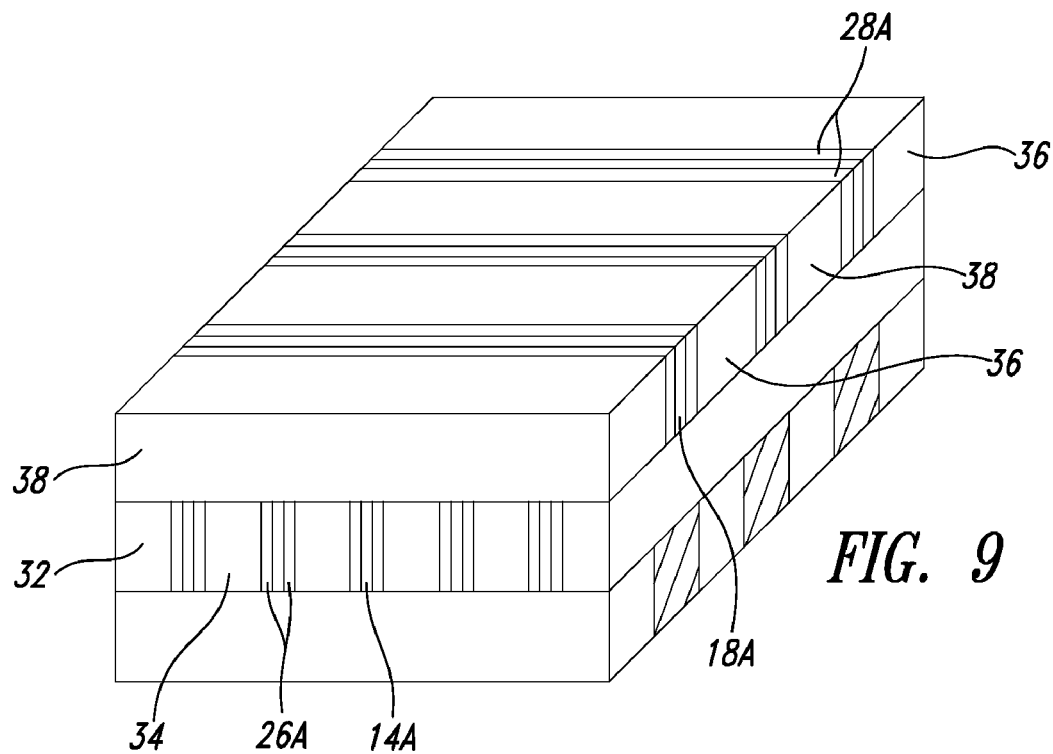
FIG. 9 is an isometric view of the phase change memory of FIG. 2A in another manufacturing step.

In FIG. 9, second dielectric filler strips 38 are formed between the structures formed by the third dielectric strips 32, second dielectric spacer layers 28A, and heater spacer layers 18A. Like the first dielectric filler strips 34, the second dielectric filler strips 38 can be formed by conformally depositing another dielectric layer and planarizing, such as by CMP, the dielectric layer until the dielectric filler strips 38 have the same height as the third dielectric strips 36, dielectric spacer layers 28A, and heater spacer layers 18A. In one embodiment, the dielectric filler strips 38 are of the same dielectric material as the third dielectric strips 36, although other dielectric materials could also be employed.

Figure 10:
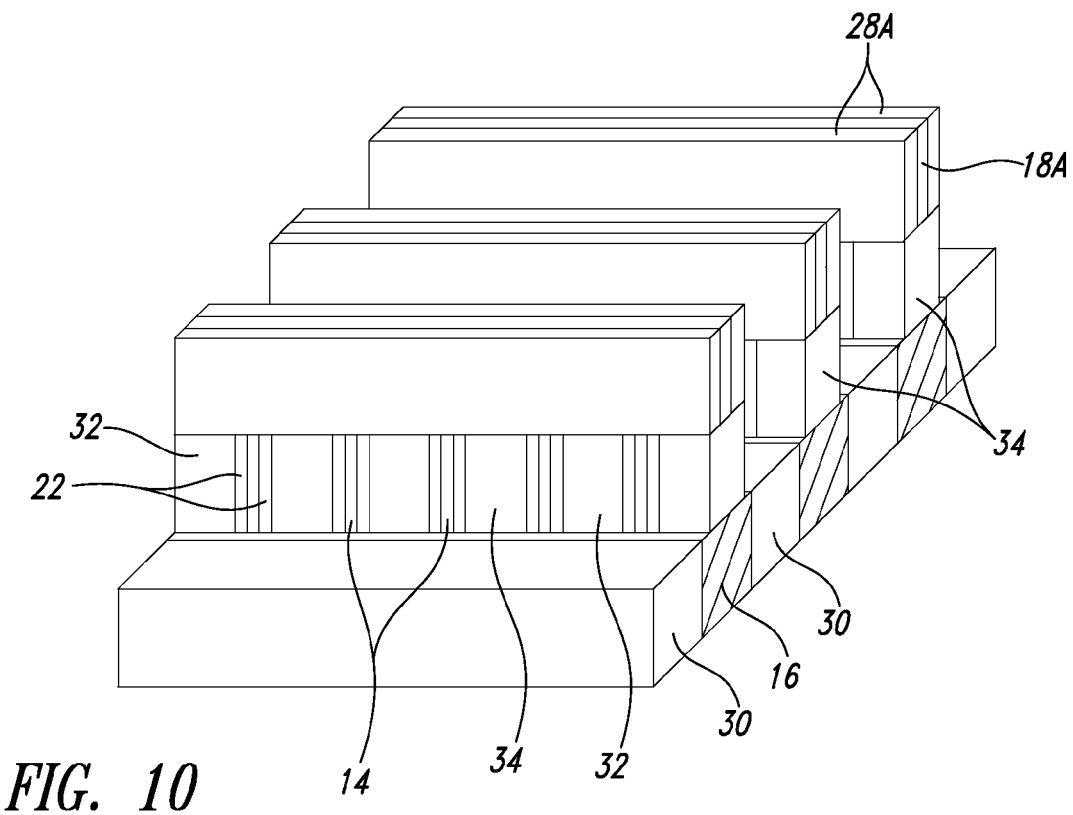
FIG. 10 is an isometric view of the phase change memory of FIG. 2A in another manufacturing step.

In FIG. 10, a self-aligned etch is performed using the second dielectric spacer layers 28A and heater spacer layers 18A as a mask. The self-aligned etch etches all of the way down to the first dielectric strips 30, which segments the phase change spacer layers 14A into the PCM storage elements 14 and segments the first dielectric spacer layers 26A into the first dielectric spacers 26.

Figure 11:
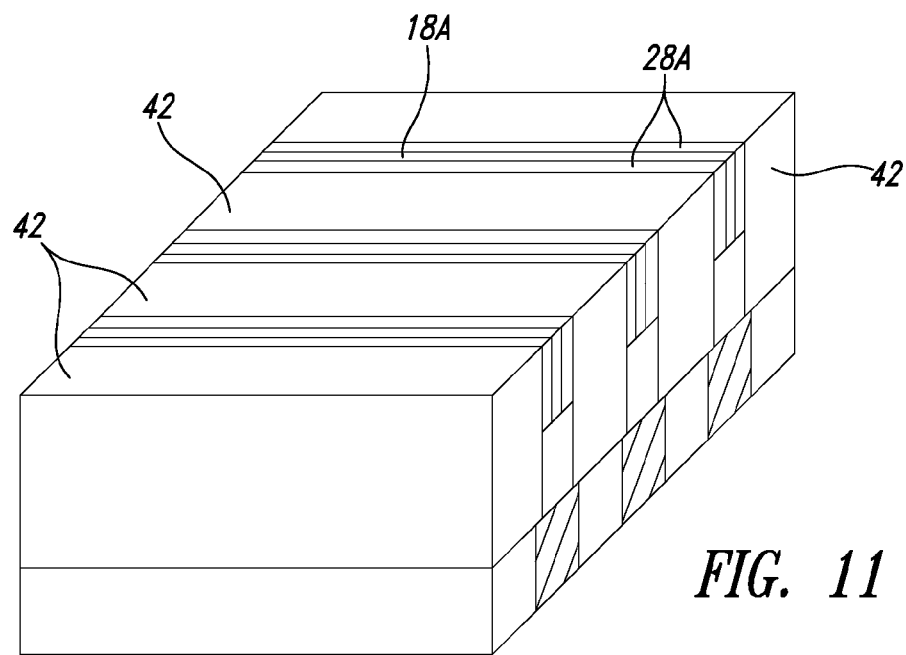
FIG. 11 is an isometric view of the phase change memory of FIG. 2A in another manufacturing step.

In FIG. 11, third dielectric filler strips 42 are formed between the structures formed by the second dielectric spacer layers 28A, heater spacer layers 18A, PCM storage elements 14, first dielectric spacers 26, and remaining portions of the second dielectric strips 32. Like the first and second dielectric filler strips 34, 38, the third dielectric filler strips 42 can be formed by conformally depositing another dielectric layer and planarizing, such as by CMP, the dielectric layer until the dielectric filler strips 42 have the same height as the dielectric spacer layers 28A and heater spacer layers 18A.

Figure 12:
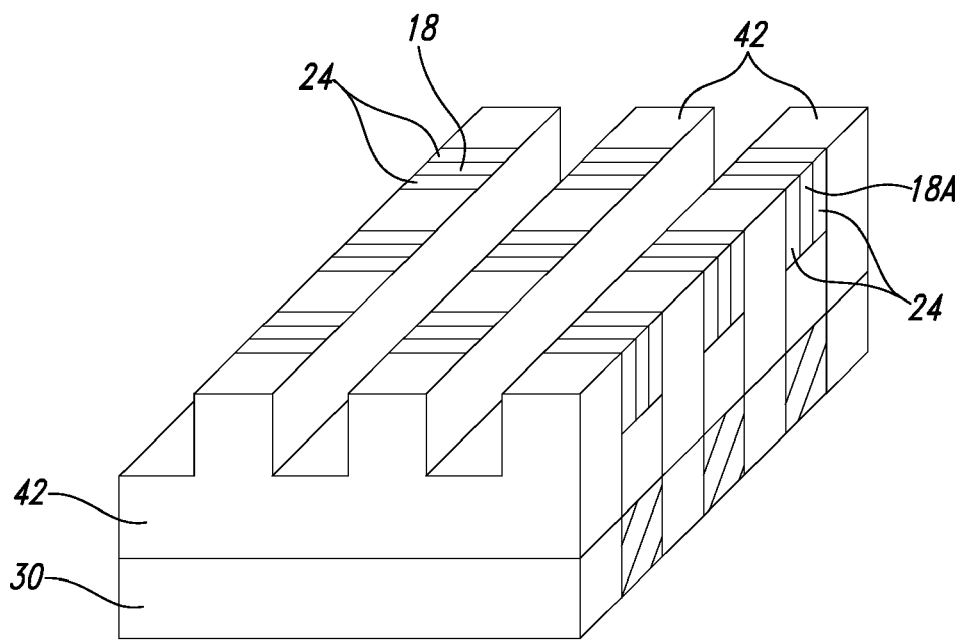
FIG. 12 is an isometric view of the phase change memory of FIG. 2A in another manufacturing step.

In FIG. 12, a strip-shaped mask (not shown) is used to etch the second dielectric spacer layers 28A, heater spacer layers 18A, and upper strips of the third dielectric filler strips 42. That segments the heater spacer layers 18A into the heaters 18 and segments the second dielectric spacer layers 28A into the second dielectric spacers 28.

Figure 13:
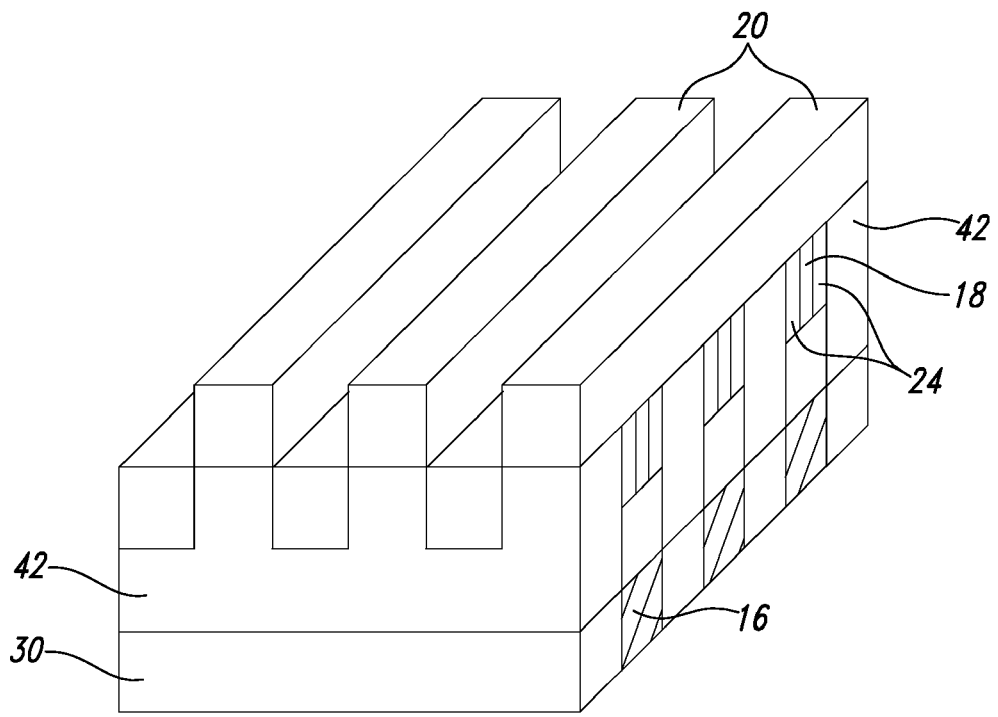
FIG. 13 is an isometric view of the phase change memory of FIG. 2A in another manufacturing step.

FIG. 13 shows the formation of top electrodes 20 on the heaters 18 and second dielectric spacers 28. The top electrodes 20 can be formed after segmenting the heater spacer layers 18A and second dielectric spacer layers 28A into the heaters 18 and second dielectric spacers 28, as shown in FIGS. 12-13. Alternatively, the top electrodes 20 can be formed first and then the heater spacer layers 18A and second dielectric spacer layers 28A can be segmented into the heaters 18 and second dielectric spacers 28 using the top electrodes as a mask. Similarly, the conductive lines 22, such as bitlines or wordlines, can also be formed on the top electrodes 20, either before or after forming the top electrodes 20, heaters 18, and second dielectric spacers 28.

Figure 14:
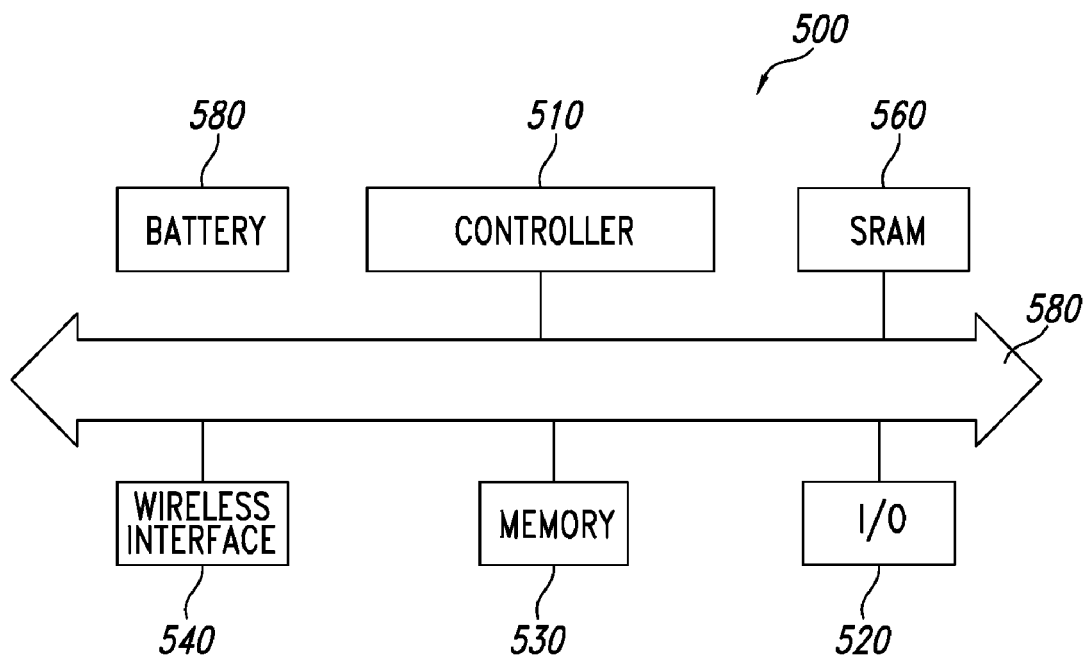
FIG. 14 is a block diagram of a system that includes a phase change memory.

Turning to FIG. 14, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g., a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase change memory, comprising:
a first heater element having a sublithographic thickness in a first direction and first and second ends;
a first pair of dielectric spacers positioned on opposite sides of the first heater element, the first pair of dielectric spacers being of a first dielectric material and each having a sublithographic thickness in the first direction;
a first storage element of phase change material having first and second ends and a sublithographic thickness in a second direction that is transverse to the first direction, the first end of the storage element contacting the second end of the heater element along the first and second directions; and
a second pair of dielectric spacers positioned on opposite sides of the first storage element, each dielectric spacer of the second pair having a sublithographic thickness in the second direction.

2. The phase change memory of claim 1 wherein the first dielectric spacers are of a first dielectric material and the second dielectric spacers are of a second dielectric material that is different than the first dielectric material.

3. The phase change memory of claim 1 wherein the first end of the storage element extends longitudinally substantially parallel to the first direction and the second end of the heater extends longitudinally substantially parallel to the second direction.

4. The phase change memory of claim 1 wherein the first heater element is positioned below the first storage element.

5. The phase change memory of claim 1 wherein the first heater element extends longitudinally substantially parallel to the second direction and the first storage element transversely contacts the first heater element at a first contact area, the phase change memory further comprising:
a second storage element transversely contacting the first heater element at a second contact area that is spaced apart from the first contact area in the second direction.

6. The phase change memory of claim 5, further comprising:
a second heater element spaced apart from the first heater element in the first direction; and
a third storage element transversely contacting the second heater element at a third contact area.

7. The phase change memory of claim 1, wherein the first storage element transversely contacts the first heater element at a first contact area, the phase change memory further comprising:
a second heater element spaced apart from the first heater element in the first direction; and
a second storage element transversely contacting the second heater element at a second contact area that is spaced apart from the first contact area in the first direction.

8. The phase change memory of claim 7, further comprising:
a third heater element spaced apart from the first heater element in the second direction; and
a third storage element transversely contacting the third heater element at a third contact area.

9. The phase change memory of claim 8, wherein the second and third heater elements and the second and third storage elements have respective first and second ends, the phase change memory further comprising:
a conductive first array line extending longitudinally in the first direction and electrically contacting the second ends of the first and second storage elements; and
a conductive second array line extending longitudinally in the second direction and electrically contacting the first ends of the first and second heater elements.

10. The phase change memory of claim 1, further comprising:
a first electrode contacting the first end of the heater element; and
a second electrode contacting the second end of the storage element.

11. The system of claim 1 wherein the first dielectric spacers are of a first dielectric material and the second dielectric spacers are of a second dielectric material that is different than the first dielectric material.

12. The phase change memory of claim 1, wherein the thicknesses of the first heater and dielectric spacers of the first pair are substantially perpendicular to the thicknesses of the first storage element and the dielectric spacers of the second pair.

13. The phase change memory of claim 1, wherein the sublithographic thicknesses of the first heater, first pair of dielectric spacers, first storage element, and second pair of spacers are less than 20 nm.

14. A system, comprising:
a processor;
a phase change memory coupled to the processor, the phase change memory including:
a first heater element having a sublithographic thickness in a first direction and first and second ends;
a first pair of dielectric spacers positioned on opposite sides of the first heater element, the first pair of dielectric spacers being of a first dielectric material and each having a sublithographic thickness in the first direction;
a first storage element of phase change material having first and second ends and a sublithographic thickness in a second direction that is transverse to the first direction, the first end of the storage element contacting the second end of the heater element along the first and second directions; and
a second pair of dielectric spacers positioned on opposite sides of the first storage element, each dielectric spacer of the second pair having a sublithographic thickness in the second direction.

15. The system of claim 14 wherein the first end of the storage element extends longitudinally substantially parallel to the in a first direction and the second end of the heater extends longitudinally substantially parallel to the second direction.

16. The system of claim 14 wherein the first heater element is positioned below the first storage element.

17. The phase change memory of claim 14 wherein the first heater element extends longitudinally substantially parallel to the second direction and the first storage element transversely contacts the first heater element at a first contact area, the phase change memory further including:
a second storage element transversely contacting the first heater element at a second contact area that is spaced apart from the first contact area in the first-second direction.

18. The system of claim 17, wherein the phase change memory includes:
a second heater element spaced apart from the first heater element in the first direction; and
a third storage element transversely contacting the second heater element at a third contact area.

19. The system of claim 17, wherein the phase change memory includes:
a second heater element spaced apart from the first heater element in a second direction that is transverse to the first direction; and
a third storage element transversely contacting the second heater element at a third contact area.

20. The system of claim 14, wherein the first storage element transversely contacts the first heater element at a first contact area, the phase change memory further including:
a second heater element spaced apart from the first heater element in the first direction; and
a second storage element transversely contacting the second heater element at a second contact area that is spaced apart from the first contact area in the first direction.

21. The system of claim 20, wherein the phase change memory includes:
a third heater element spaced apart from the first heater element in the second direction; and
a third storage element transversely contacting the third heater element at a third contact area.

22. The system of claim 21, wherein the second and third heater elements and the second and third storage elements have respective first and second ends, the phase change memory further including:
a conductive first array line extending longitudinally in the first direction and electrically contacting the second ends of the first and second storage elements; and
a conductive second array line extending longitudinally in the second direction and electrically contacting the first ends of the first and second heater elements.

23. The system of claim 14, wherein the phase change memory includes:
a first electrode contacting the first end of the heater element; and
a second electrode contacting the second end of the storage element.

24. The system of claim 14, wherein the thicknesses of the first heater and dielectric spacers of the first pair are substantially perpendicular to the thicknesses of the first storage element and the dielectric spacers of the second pair.

25. The system of claim 14, wherein the sublithographic thicknesses of the first heater, first pair of dielectric spacers, first storage element, and second pair of spacers are less than 20 nm.

26. A method, comprising:
forming a phase change memory, the forming including:
forming a first heater element having first and second ends;
forming a first pair of dielectric spacers positioned on opposite sides of the first heater element, the first pair of dielectric spacers being of a first dielectric material;
forming a first storage element of phase change material having first and second ends, the first end of the storage element contacting the second end of the heater element; and
forming a second pair of dielectric spacers positioned on opposite sides of the first storage element, wherein forming the first heater element and forming the first pair of dielectric spacers include:
forming a first dielectric strip having a top and first and second side walls;
depositing a first layer of the first dielectric material on the top and first side wall of the first dielectric strip;
anisotropically etching the first layer to leave on the first side wall a first dielectric spacer of the first pair of dielectric spacers;
depositing a resistive layer on the top of the dielectric strip and a side wall of the first dielectric spacer;
anisotropically etching the resistive layer to leave the first heater element on the side wall of the first dielectric spacer;
depositing a second layer of the first dielectric material on the top of the dielectric strip and a side wall of the first heater element; and
anisotropically etching the second layer to leave on the side wall of the first heater element a second dielectric spacer of the first pair of dielectric spacers.

27. The method of claim 26, wherein forming the first storage element and forming the second pair of dielectric spacers include:
forming a second dielectric strip having a top and a side wall;
depositing a first layer of a second dielectric material on the top and side wall of the second dielectric strip;
anisotropically etching the first layer of the second dielectric material to leave on the side wall a first dielectric spacer of the second pair of dielectric spacers;
depositing a phase change layer on the top of the second dielectric strip and a side wall of the first dielectric spacer of the second pair of dielectric spacers;
anisotropically etching the phase change layer to leave the first storage element on the side wall of the first dielectric spacer of the second pair of dielectric spacers;
depositing a second layer of the second dielectric material on the top of the dielectric strip and a side wall of the first storage element; and
anisotropically etching the second layer of the second dielectric material to leave on the side wall of the first storage element a second dielectric spacer of the second pair of dielectric spacers.

28. The method of claim 26, wherein:
depositing the first layer of the first dielectric material includes depositing the first layer of the first dielectric material on the second side wall of the first dielectric strip;
anisotropically etching the first layer leaves on the second side wall a first dielectric spacer of a third pair of dielectric spacers;
depositing the resistive layer on the top of the dielectric strip and the side wall of the first dielectric spacer of the first pair of dielectric spacers includes depositing the resistive layer on a side wall of the first dielectric spacer of the third pair of dielectric spacers;
anisotropically etching the resistive layer also leaves a second heater element on the side wall of the of the first dielectric spacer of the third pair of dielectric spacers;
depositing the second layer of the first dielectric material includes depositing the second layer of the first dielectric material on a side wall of the second heater element; and
anisotropically etching the second layer also leaves on the side wall of the second heater element a second dielectric spacer of the third pair of dielectric spacers.

29. A method, comprising:
forming a phase change memory, the forming including:
forming a first heater element having first and second ends;

forming a first pair of dielectric spacers positioned on opposite sides of the first heater element, first pair of dielectric spacers being of a first dielectric material;

forming a first storage element of phase change material having first and second ends, the first end of the storage element contacting the second end of the heater element;

forming a second pair of dielectric spacers positioned on opposite sides of the first storage element, wherein the first heater element extends longitudinally in a first direction and the first storage element transversely contacts the first heater element at a first contact area; and forming a second storage element transversely contacting the first heater element at a second contact area that is spaced apart from the first contact area in the first direction.

30. The method of claim 29, further comprising:

forming a second heater element spaced apart from the first heater element in a second direction that is transverse to the first direction; and forming a third storage element transversely contacting the second heater element at a third contact area.

31. A phase change memory, comprising:

a first heater element having first and second ends;

a first pair of dielectric spacers positioned on opposite sides of the first heater element, the first pair of dielectric spacers being of a first dielectric material;

a first storage element of phase change material having first and second ends, the first end of the storage element contacting the second end of the heater element, wherein the first heater element extends longitudinally in a first direction and the first storage element transversely contacts the first heater element at a first contact area;

a second pair of dielectric spacers positioned on opposite sides of the first storage element; and a second storage element transversely contacting the first heater element at a second contact area that is spaced apart from the first contact area in the first direction.

32. The phase change memory of claim 31, further comprising:

a second heater element spaced apart from the first heater element in a second direction that is transverse to the first direction; and a third storage element transversely contacting the second heater element at a third contact area.

33. A system, comprising:

a processor;

a phase change memory coupled to the processor, the phase change memory including:

a first heater element having first and second ends;

a first pair of dielectric spacers positioned on opposite sides of the first heater element, the first pair of dielectric spacers being of a first dielectric material;

a first storage element of phase change material having first and second ends, the first end of the storage element contacting the second end of the heater element, wherein the first heater element extends longitudinally in a first direction and the first storage element transversely contacts the first heater element at a first contact area;

a second pair of dielectric spacers positioned on opposite sides of the first storage element; and a second storage element transversely contacting the first heater element at a second contact area that is spaced apart from the first contact area in the first direction.

* * * * *

UNITED STATES PATENT AND TRADEMARK OFFICE
CERTIFICATE OF CORRECTION

| | | |
|---|---|---|
| PATENT NO. | : 8,049,197 B2 | |
| APPLICATION NO. | : 12/346702 | |
| DATED | : November 1, 2011 | |
| INVENTOR(S) | : DerChang Kau | |

It is certified that error appears in the above-identified patent and that said Letters Patent is hereby corrected as shown below:

Column 10, Line 54:
"to the in a first direction and the second end of the heater" should read, --to the first direction and the second end of the heater--.

Column 10, Line 66:
"apart from the first contact area in the first-second direction." should read, --apart from the first contact area in the second direction.--.

Signed and Sealed this
Fourteenth Day of February, 2012

David J. Kappos
*Director of the United States Patent and Trademark Office*